United States Patent [19]
Moksu et al.

[11] 3,833,836
[45] Sept. 3, 1974

[54] PRINTED CIRCUIT BOARD PACKAGE WITH COOLING AND VIBRATION DAMPING MEANS

[75] Inventors: Alan W. Moksu, Nashua; Joseph C. Briley, Milford, both of N.H.

[73] Assignee: Sanders Associates, Inc., Nashua, N.H.

[22] Filed: June 18, 1973

[21] Appl. No.: 370,901

[52] U.S. Cl. .......................... 317/100, 317/101 DH
[51] Int. Cl. .......................................... H05k 7/20
[58] Field of Search......... 317/100, 101 D, 101 DH, 317/101 CM, 120; 174/68.5; 188/1 B

[56] References Cited

UNITED STATES PATENTS

| | | | |
|---|---|---|---|
| 3,141,998 | 7/1964 | Silkman | 317/100 |
| 3,522,474 | 8/1970 | Piel | 317/101 CM |
| 3,541,396 | 11/1970 | Cardwell | 317/101 DH |
| 3,582,714 | 6/1971 | Lynbrook | 317/120 |
| 3,593,064 | 7/1971 | Eitra | 317/100 |
| 3,631,297 | 12/1971 | Conner | 317/101 CM |
| 3,735,206 | 5/1973 | Pesek | 317/101 DH |

*Primary Examiner*—Robert K. Schaffer
*Assistant Examiner*—Gerald P. Tolin
*Attorney, Agent, or Firm*—Louis Etlinger; Richard I. Seligman

[57] ABSTRACT

Printed circuit board package for severe environmental conditions of temperature, humidity and altitude as well as for relatively high vibration applications. First and second printed circuit boards are arranged in the recesses of first and second metallic plates and a resilient means located between the two printed circuit boards presses each board against its corresponding recess surface. In one embodiment, the resilient means takes the form of a sheetlike assembly consisting of a plurality of parallel arranged strips of rubber tubing which are held together by means of a severe environmental tape, such as high temperature fluorocarbon tape.

6 Claims, 3 Drawing Figures

PRINTED CIRCUIT BOARD PACKAGE WITH COOLING AND VIBRATION DAMPING MEANS

BACKGROUND OF THE INVENTION

1. Field of the Invention

This invention relates generally to the packaging of printed circuit boards and in particular to a novel and improved packaging assembly which has high resistance to vibration and which is adapted for use in rather severe environmental conditions.

2. Description of the Prior Art

In the electronics industry, printed circuits boards are being used more and more in the assembly of electronic circuits. In general, the circuit components are mounted on one side of the board and connections between the various components and to a set of pin connectors along one edge of the board are made by means of plated through holes in the board as well as solder runs on both sides of the board. The initial design of such a printed circuit board is a costly and time consuming procedure. However, once the printed circuit board has been designed and a master film made, the circuit board is reproducible with a minimum of labor and expense.

It is, of course, desirable to employ a small number of rather large printed circuit boards as distinguished from a larger number of small printed circuit boards in the design of electronic circuitry in order to reduce the number of wiring interconnections which must be made by hand during the assembly or fabrication process. This generally is not a problem for installations where the assembled circuits remain stationary. However, in installations where the printed circuit boards are subject to vibration, as in moving vehicles such as aircraft, space vehicles, and others, the boards, even though secured at their edges, tend to vibrate or oscillate with maximum motion of vibration at their centers due to the resonsant response of the plastic board material. This excessive vibration or "oil canning" in turn causes failure of components and solder connections.

Many prior art attempts have been made to solve the "oil canning" problem. In one prior art solution, exemplified by U.S. Pat. No. 3,324,974, a cross shaped damper formed of visco-elastic material is secured to one side of the printed circuit board. In another prior solution, exemplified by U.S. Pat. No. 3,631,297, a rigid foam is sandwiched between the printed circuit board and a metallic support plate. In the use of either of these proposed solutions, it is difficult to design a plural board assembly with adequate heat transfer for a relatively small space or volume requirement.

BRIEF SUMMARY OF THE INVENTION

An object of the present invention is to provide a novel and improved printed circuit package.

Another object is to provide a novel and improved printed circuit package which is highly resistant to resonant vibrations and which efficiently transfers dissipated heat away from the printed circuit board.

Still another object is to provide a printed circuit board package which can be directly bolted to other similar packages in a plural printed circuit board assembly and still efficiently transfer dissipated heat away from the printed circuit board.

In brief, a printed circuit board package embodying the invention takes the form of a sandwich like structure including first and second metallic plates each having in one surface thereof a recess which is lined with a layer of electrically nonconductive material. First and second printed boards are arranged in the recesses of the first and second plates. A resilient means located between the printed circuit boards presses the boards against the coresponding recess surfaces securely enough to prevent substantial "oil canning" of the boards.

BRIEF DESCRIPTION OF THE DRAWINGS

In the accompanying drawings, like reference characters denote like elements of structure.

DESCRIPTION OF PREFERRED EMBODIMENT

Figure 1:
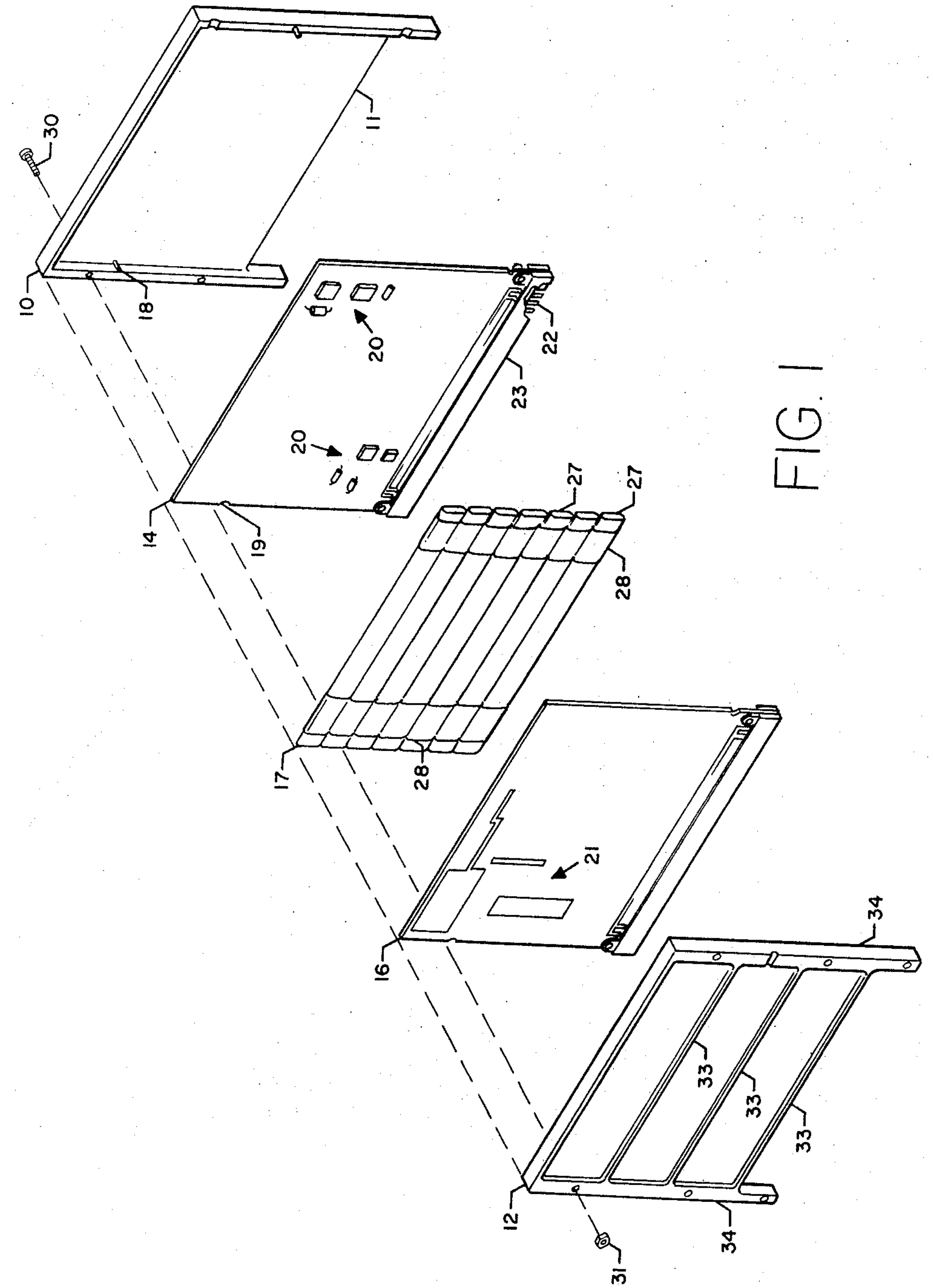
FIG. 1 is a three dimensional view of a printed circuit board package embodying the present invention.

Referring now to FIG. 1, a printed circuit board package embodying the present invention takes the form of a sandwich like structure which includes a pair of metallic support plates 10 and 12 each having a recess in one surface thereof to receive the printed circuit boards 14 and 16, respectively. The boards 14 and 16 are urged against the recessed surfaces by a resilient member 17. For the purpose of a clear illustration, all of these parts are shown in FIG. 1 as disassembled with accompanying arrows which indicate the respective location of the parts when in assembled form. Thus, metallic support plate 10 has a recess 11 which is adapted to receive the printed circuit board 14. To facilitate the mating of the circuit board 14 with the recess 11, the support plate 10 includes a key element 18 which is aligned with a keyhole 19 on the printed circuit board 14. Though not shown in FIG. 1, the support plate 12 includes a similar recess and key so as to mate with the keyhole of the printed circuit board 16.

Each of the printed circuit boards includes a number of components 20 mounted on one side thereof as shown for the board 14. Adhered to each side of the board are a number of solder connections and runs as shown at 21 for the board 16. For ease of illustration, only a few of the components 20 and solder runs 21 are shown. Attached to the bottom side of printed circuit boards 14 and 16 are a number of pin connectors as shown at 22 of board 14 where the protective pin covering 23 has been broken away.

Figure 3:
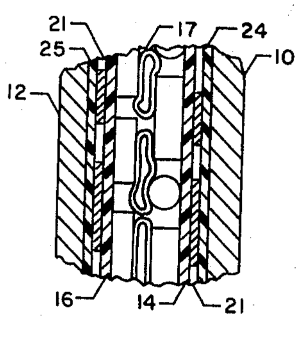
FIG. 3 is a cross sectional view taken along the lines 3³ in FIG. 2.

In order to prevent the metallic plates 10 and 12 from shorting the solder runs 21 on the backsides of the boards 14 and 16, each of the recesses in the support plate is given a relatively thin coating (on the order of 0.002 to 0.005 inch) of an electrically nonconductive material, such as epoxy. This is best seen in the cross sectional view of FIG. 3 where the reference characters 24 and 25 denote the nonconductive coating for the plates 10 and 12, respectively. A typical method of applying the nonconductive coatings 24 and 25 to the recess surfaces is either by spraying or painting the epoxy material on the surface to the desired thickness.

In assembled form, the sandwich structure is held together by means of four screws and associated nuts, one for each corner of the structure. For ease of illustration, only one of the screws designated as 30 and its associated nut 31 is shown in FIG. 1. The purpose of the resilient means or member 17 is to press the boards 14 and 16 against the recess surfaces of the metallic plates 10 and 12. This is best seen in the cross sectional view of FIG. 3 where the resilient member 17 is shown in compressed form as it presses the two printed circuit boards 14 and 16 against the recess surfaces of the support plates 10 and 12. Preferably, the recess depths and the resilient member thickness are designed such that when in compressed form, the resilient member 17 is in contact with most of the components 20 mounted on each of the printed circuit boards 14 and 16, despite irregularity in component height.

Figure 2:
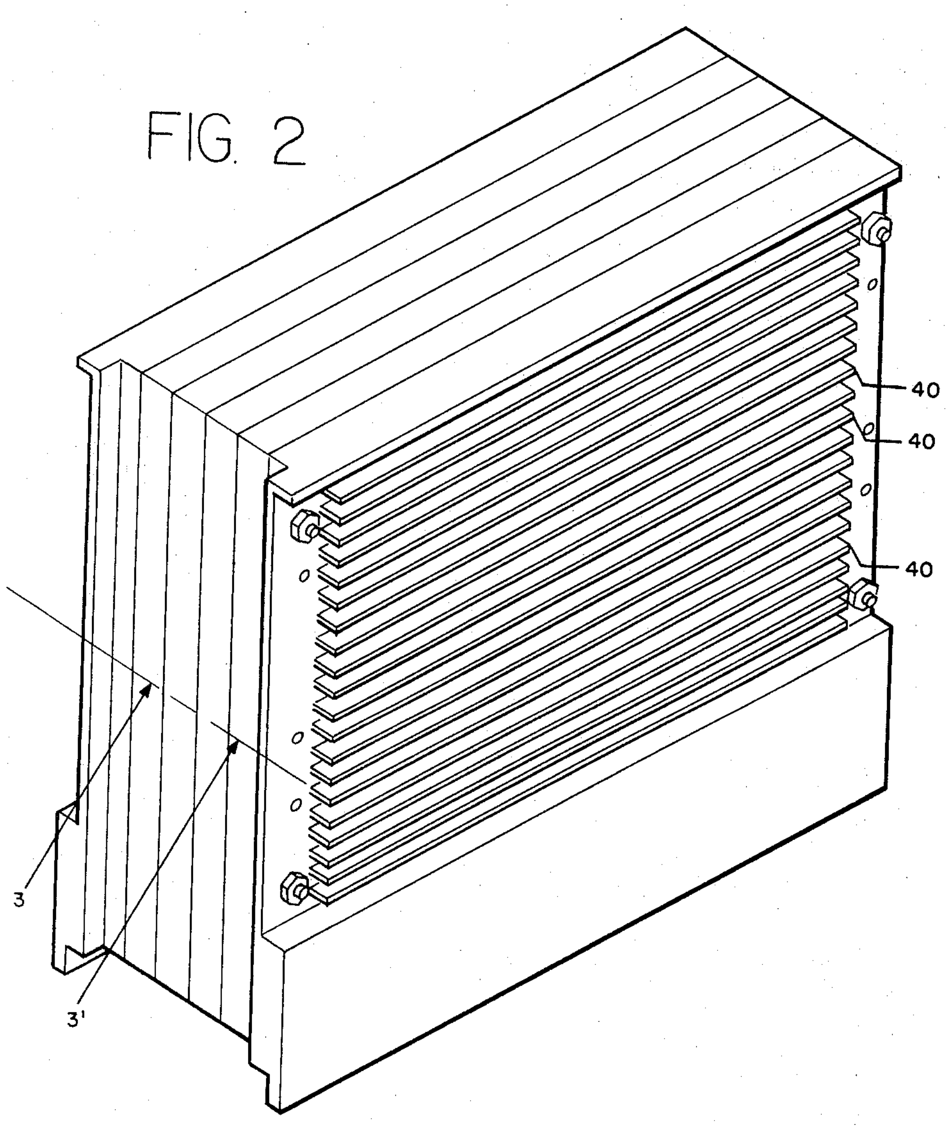
FIG. 2 is a three dimensional view of a plurality of printed circuit board packages embodying the present invention arranged in a stacked assembly.

It is contemplated that the resilient member 17 may take the form of any resilient sheet material, such as rubber, plastic foam, and the like. It has been discovered that many of the sponge and foam type materials become deformed and lose some of their resilience with extreme conditions of altitude, humidity and temperature. For this reason, the resilient member 17 preferably takes the form of a number of parallel strips of silicon rubber tubes 27 which are held together by means of tapes 28, which may suitably be a high temperature fluorocarbon tape. The resilient tubes 27 may suitably be of the type generally used in surgical applications. For example, the tubes 27 may suitably be ovular shaped compression silicon tubing available from Chase Walton Elastomers, Inc., of Hudson, Massachusetts. The support plates 10 and 12 may be made of any suitable metal, such as aluminum. The plates 10 and 12 may be formed by any suitable process as for example, casting. The thickness of the support plate in the recess area is generally thin (on the order of 0.10 inches) for the purpose of cooling and light weight. The rib elements 33 on the back side of the recess surface generally provide strength for the thin recess plate as well as heat conducting channels to the outer legs 34 of the support plate. The outer surfaces of the ribs 33 and legs 34 are generally flat so that a plurality of printed circuit packages may be stacked or bolted together as shown in the perspective view of FIG. 2. For this case, the two outside support plates of the entire stacked together configuration additionally have formed on the rear side of their respective recessed areas a number of heat exchanger elements 40.

In one exemplary design of the printed circuit board package, the printed circuit boards are 5.4 inches × 6.9 inches. Seven 0.50 inch (outer diameter) tubes of the aforementioned tubing are employed for the resilient member 17. The recess area of the support plates is given a thickness of 0.10 inch. The leg members are given a thickness of 0.10 inch and the recesses have a depth of 0.23 inch.

It will be seen from the foregoing that the novel and improved printed circuit package embodying the present invention efficiently obtains the objects. Since certain changes may be made in the illustrated embodiment without departing from the scope of the invention, it is intended that all matter contained in the above description and shown in the accompanying drawing shall be interpreted as illustrative and not in a limiting sense.

What is claimed is:

1. A printed circuit board package comprising a sandwich like structure which includes first and second metallic plates each having on one surface a recess providing a recessed surface which is lined with a layer of electrically nonconductive material, said recessed surface being at least as large as any printed circuit board to be accommodated therein;

first and second printed circuit boards arranged in the recesses of the first and second plates, and against the recessed surface, respectively; and resilient means located between the printed circuit boards and urging the boards against the corresponding recess surfaces.

2. A printed circuit board package as set forth in claim 1 wherein said resilient means comprises a sheetlike assembly.

3. A printed circuit board package as set forth in claim 2 wherein said sheetlike assembly includes a plurality of parallel arranged strips of resilient tubes.

4. The invention as set forth in claim 3 wherein said printed circuit package is one of a plurality of such packages which are fastened together to form a stacked array.

5. The printed circuit board assembly as set forth in claim 4 wherein the outer support plates of said assembly include heat exchanger elements on the backsides of their respective recesses.

6. The printed board package as set forth in claim 1 wherein each of said printed circuit boards includes a number of components on one side thereof and a number of solder connections and runs on the other side thereof, said sides having said solder connections being disposed against the recessed surfaces in said metallic plates whereby said resilient means also substantially precludes movement of said components.

* * * * *